(12) United States Patent
Ni et al.

(10) Patent No.: US 7,474,715 B1
(45) Date of Patent: Jan. 6, 2009

(54) VARIABLE LOAD CIRCUIT FOR REDUCING QUADRATURE PHASE ERROR

(75) Inventors: Wenhai Ni, High Point, NC (US); Kelvin Kai Tuan Yan, Oak Ridge, NC (US); Mark Alexander John Moffat, Santa Cruz, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 745 days.

(21) Appl. No.: 10/855,853

(22) Filed: May 27, 2004

(51) Int. Cl.
*H03C 1/52* (2006.01)
*H03G 3/12* (2006.01)

(52) U.S. Cl. ...................... 375/330; 330/283
(58) Field of Classification Search ................. 375/330, 375/316, 319, 331; 330/283; 455/307
See application file for complete search history.

(56) References Cited

U.S. PATENT DOCUMENTS

| | | | |
|---|---|---|---|
| 2004/0014450 A1* | 1/2004 | Yamamoto et al. | 455/307 |
| 2005/0134396 A1* | 6/2005 | Pehlke et al. | 332/103 |
| 2006/0220743 A1* | 10/2006 | Kojima | 330/283 |

OTHER PUBLICATIONS

Elmala et al. "A Self-Calibration Technique for Mismatches in Image-Reject Receivers," IEEE, 2002 Custom Integrated Circuits Conference. p. 251-254.

Hornak et al. "An Image-Rejecting Mixer and Vector Filter with 55-dB Image Rejection over Process, Temperature, and Transistor Mismatch," IEEE Journal of Solid-State Circuits, vol. 36, No. 1, 2001. p. 23-33.

Razavi, Behzad. "Architectures and Circuits for RF CMOS Receivers," IEEE, 1998 Custom Integrated Circuits Conference. p. 393-400.

* cited by examiner

*Primary Examiner*—Khai Tran
(74) *Attorney, Agent, or Firm*—Withrow & Terranova, P.L.L.C.

(57) ABSTRACT

A variable load circuit for adjusting a phase of a differential signal including a first transistor having a first terminal adapted to receive a first component of the differential signal, a second transistor having a first terminal adapted to receive a second component of the differential signal and a second terminal coupled to a second terminal of the first transistor, and a variable current source coupled to a third terminal of both the first and second transistors. The variable current source generates a bias current based on a control signal. For each of the first and second transistors, a first capacitance is created between the first and second terminals, and a second capacitance is created between the first and third terminals. The first and second capacitances are each a function of the bias current and thus the control signal and operate to adjust the phase of the differential signal.

35 Claims, 5 Drawing Sheets

VARIABLE LOAD CIRCUIT FOR REDUCING QUADRATURE PHASE ERROR

FIELD OF THE INVENTION

The present invention relates to correcting a phase error between in-phase and quadrature components of a quadrature signal, and more particularly relates to a variable load circuit for adjusting the phase of a component of a quadrature signal to correct phase error.

BACKGROUND OF THE INVENTION

In wireless communication systems, it is often desirable to generate a quadrature local oscillator (LO) signal for either upconversion of a signal to be transmitted or downconversion of a received signal. Ideally, the quadrature LO signal includes a quadrature component (Q) that leads an in-phase component (I) in phase by 90°. However, due to factors such as a non-symmetrical layout and component mismatch, a phase error is created. For example, a phase error of 2° may be created such that the quadrature component (Q) leads the in-phase component (I) by 92° instead of 90°. The phase error limits image rejection and thus the overall performance of the transceiver.

In order to reduce the phase error of the quadrature LO signal, designers strive to provide both a symmetrical design and a symmetrical layout. However, in reality, there still remains electrical differences between the I and Q branches. Further, the fabrication process inevitably creates mismatches in components in the I and Q branches, which result in additional phase error. To reduce the phase error to an acceptable level, designers often go through a trial and error process to find a layout that reduces the phase error to an acceptable level. Thus, there remains a need for a system and method for easily correcting such phase error.

SUMMARY OF THE INVENTION

The present invention provides a variable load circuit for adjusting a phase of a differential signal. In general, the variable load circuit includes a pair of transistors each receiving one component of a differential signal. Each of the transistors includes capacitances between the terminals of the transistor, where the capacitances are each a function of a tail current of the differential pair. A variable current source controls the tail current of the differential pair of transistors based on a control signal, thereby controlling the capacitances and thus a phase of the differential signal. The control signal may be either a digital control signal or an analog control signal.

In general, the variable load circuit includes a first transistor having a first terminal adapted to receive a first component of the differential signal, a second transistor having a first terminal adapted to receive a second component of the differential signal and a second terminal coupled to a second terminal of the first transistor, and a variable current source coupled to a third terminal of both the first and second transistors. In operation, the variable current source generates a bias current based on a control signal. For each of the first and second transistors, a first capacitance is created between the first and second terminals, and a second capacitance is created between the first and third terminals. The first and second capacitances are each a function of the bias current and operate to adjust the phase of the differential signal. Accordingly, the control signal is provided to adjust the bias current and thus the first and second capacitances and the phase of the differential signal.

In one embodiment, first and second variable loads operate to correct a phase error of a quadrature signal. The first variable load receives a differential in-phase component of the quadrature signal and operates to adjust the phase of the in-phase component based on a first control signal. The second variable load receives a differential quadrature component of the quadrature signal and operates to adjust the phase of the quadrature component based on a second control signal. The first and second control signals are provided such that the phase error of the quadrature signal is essentially zero. When the quadrature component leads the in-phase component by less than 90°, the control signals are provided such that the in-phase component is delayed with respect to the quadrature component by an amount that essentially corrects the phase error. When the quadrature component leads the in-phase component by more than 90°, the control signals are provided such that the quadrature component is delayed with respect to the in-phase component by an amount that essentially corrects the phase error.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 4:
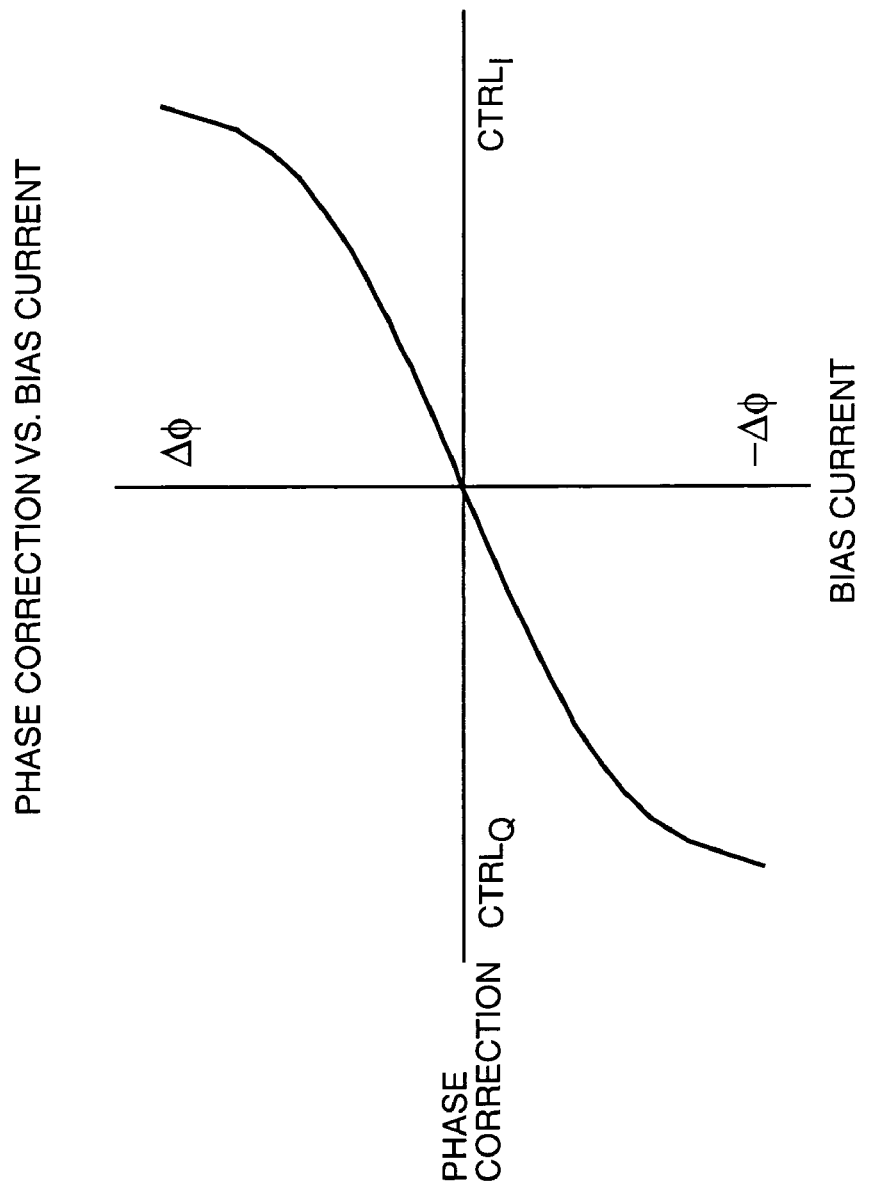

FIG. 4 graphically illustrates phase correction versus DC bias current; and

Figure 5:
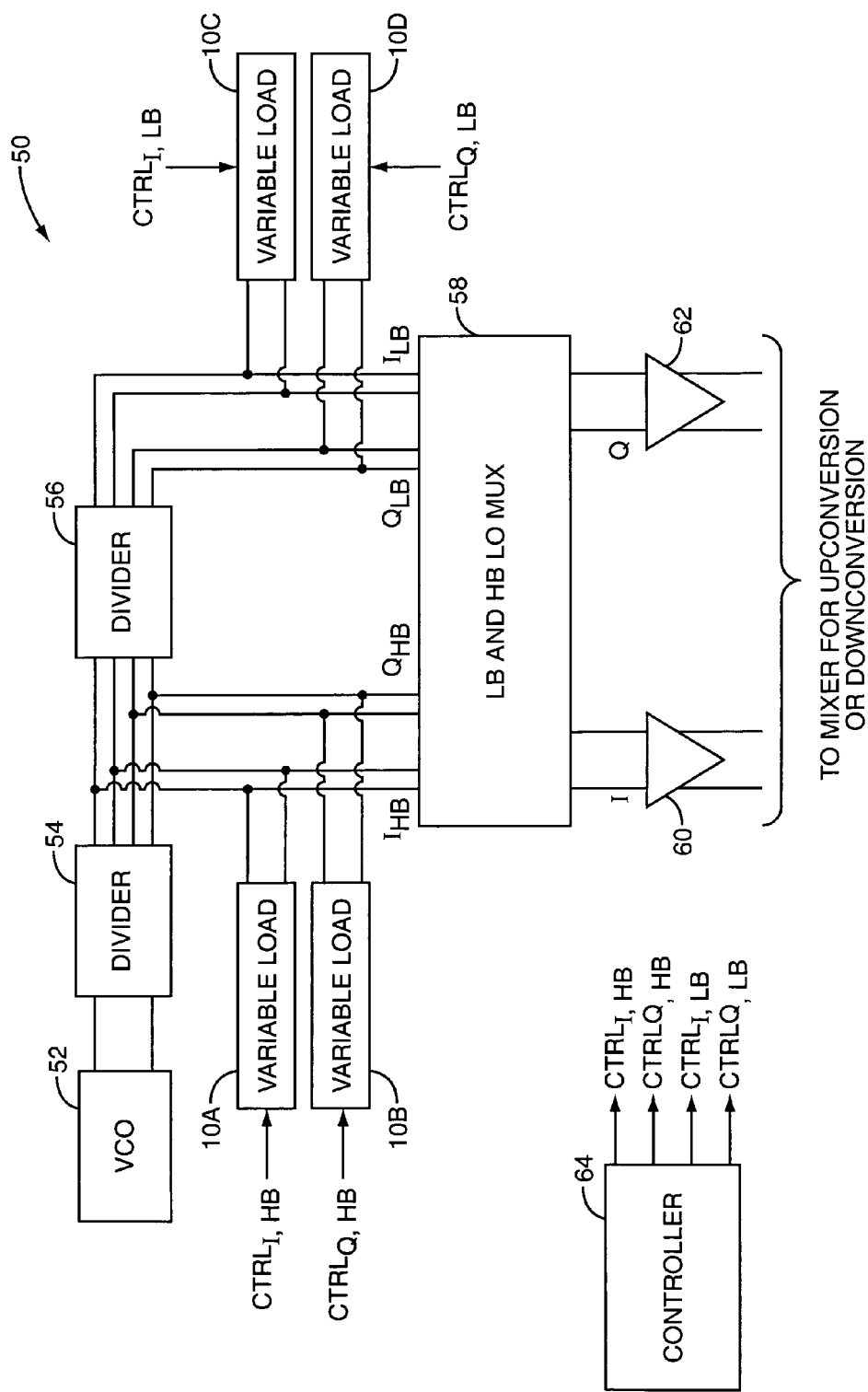

FIG. 5 illustrates a quadrature local oscillator (LO) generator including variable load circuits of the present invention for correcting the phase error of the quadrature LO signal according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
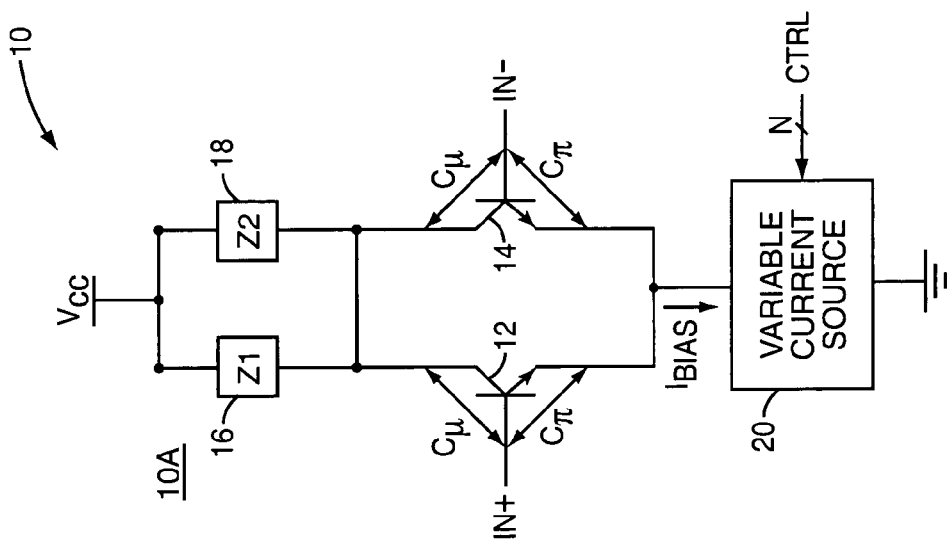
FIG. 1 illustrates a variable load circuit for adjusting a phase of a differential signal according to one embodiment of the present invention.

FIG. 1 illustrates a variable load circuit 10 having a variable capacitance according to one embodiment of the present invention. The variable load circuit 10 operates as a variable capacitive load for adjusting a phase of a differential signal (IN+ and IN−). The variable load circuit 10 includes transistors 12 and 14, impedance circuits 16 and 18, and a variable current source 20 arranged as illustrated. A capacitance Cπ exists between the base and collector of each of the transistors 12 and 14, and a capacitance Cµ exists between the base and emitter of each of the transistors 12 and 14. The capacitances Cπ and Cµ are each functions of a bias current ($I_{BIAS}$), also known as a tail current, generated by the variable current source 20. More specifically, the capacitance (Cπ) is defined as:

$$C_\pi = C_b + C_{je}, \text{ where}$$

$$C_b = \tau g_m, \text{ and}$$

$$g_m = \frac{I_C}{V_{th}}.$$

$C_b$ is a base-charging capacitance, τ is a base transit time constant, and $g_m$ is a small signal bipolar transconductance of the transistor 12 or 14. Cje is an emitter-base depletion layer capacitance. Typically, Cje is much smaller than $C_b$ and can be ignored. Therefore $C_\pi$ is essentially a linear function of Ic, and thus the bias current ($I_{BIAS}$).

The capacitance (Cµ) is defined as:

$$C_\mu = \frac{C_{\mu 0}}{\left(1 + \frac{\Delta V_R}{\phi_0}\right)^n},$$

where $\Delta V_R$ is a reverse bias voltage between the collector and the base of the transistors 12 and 14. For example if the voltage at the base ($V_b$) is 1.5V and the voltage at the collector ($V_c$) is 2.0V, then $\Delta V_R$ is 0.5V. Accordingly, $$\Delta V_R = V_c - V_b.$$

As illustrated, the collector voltage ($V_c$) of the transistors 12 and 14 is a function of $V_{CC}$ and the currents through each of the impedances 16 and 18. Thus, when the base voltage ($V_b$) is fixed, as you increase the bias current ($I_{BIAS}$), the collector voltage decreases and, therefore, $\Delta V_R$ decreases and $C_\mu$ increases. Accordingly, the capacitance (Cµ) is also a function of the bias current ($I_{BIAS}$).

In operation, the capacitances Cπ and Cµ load the differential signal (IN+ and IN−) and act as a low-pass filter such that the differential signal (IN+ and IN−) is delayed by an amount of time that is dependent upon the capacitances Cπ and Cπ. Thus, by delaying the differential signal (IN+ and IN−), the variable load circuit 10 adjusts a phase of each component of the differential signal (IN+ and IN−).

The variable current source 20 generates the bias current ($I_{BIAS}$) based on a control signal (CTRL). Since the capacitances Cπ and Cµ are each a function of the bias current ($I_{BIAS}$), the control signal (CTRL) also controls the capacitances Cπ and Cµ, and thus, the phase of the differential signal (IN+ and IN−). In operation, the control signal (CTRL) may be supplied by a controller (not illustrated) to adjust the phase of the differential signal (IN+ and IN−). In one embodiment, the control signal (CTRL) is a digital control signal, and the variable current source 20 operates based on the digital control signal. In another embodiment, the control signal (CTRL) is an analog control signal, and the variable current source 20 operates based on the analog control signal.

Figure 2:
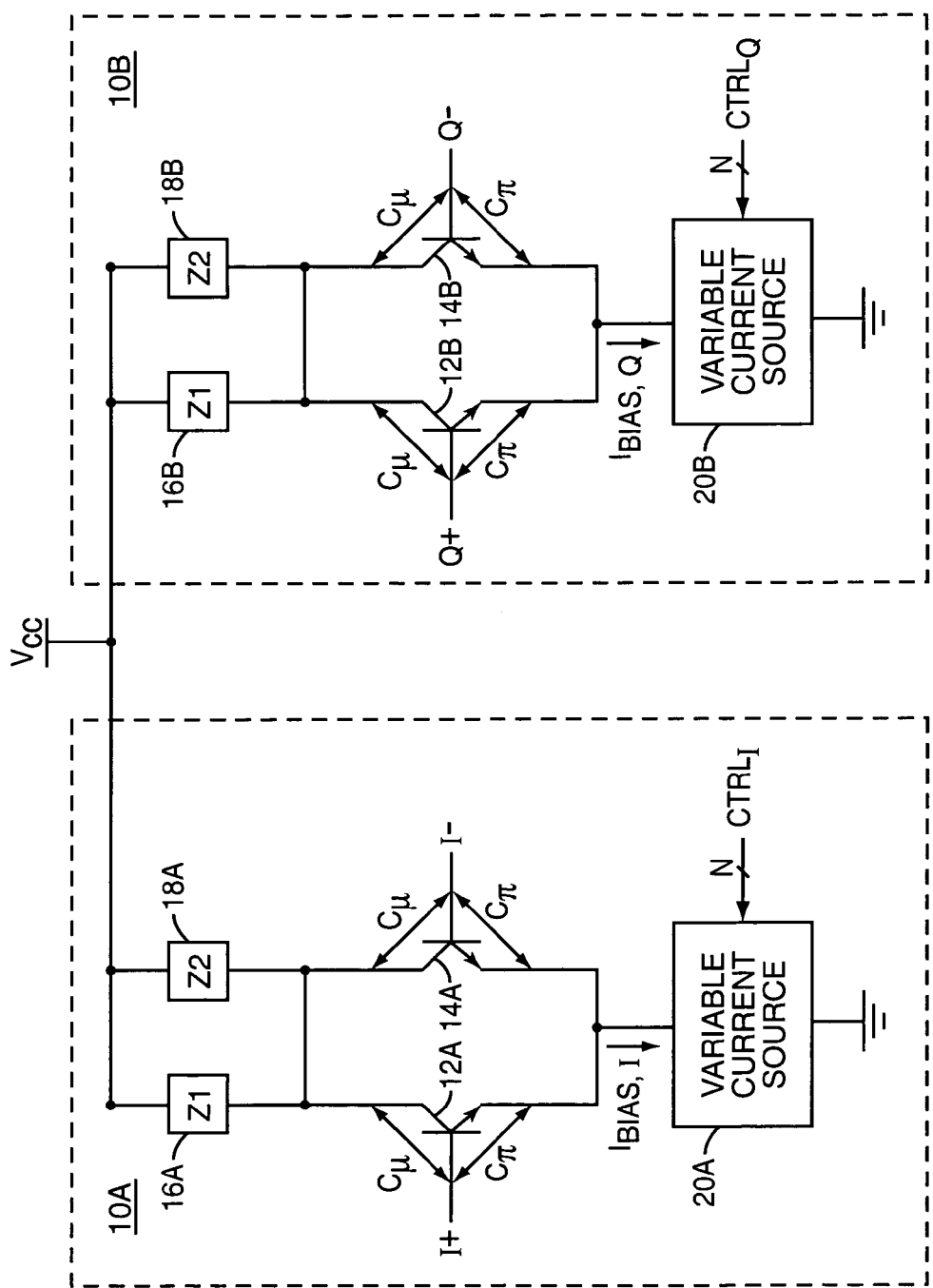
FIG. 2 illustrates a system including two variable load circuits for correcting a phase error of a quadrature signal according to one embodiment of the present invention.

FIG. 2 illustrates first and second variable load circuits 10A and 10B for adjusting the phases of an in-phase component (I) and/or a quadrature phase component (Q) of a quadrature signal to correct phase error. Each of the variable load circuits 10A and 10B operate as the described above with respect to the variable load circuit 10 of FIG. 1. In general, the variable load circuit 10A includes transistors 12A and 14A, impedance circuits 16A and 18A, and variable current source 20A. The variable load circuit 10A operates to adjust the phase of the in-phase component (I) based on the control signal ($CTRL_I$), which controls the bias current ($I_{BIAS,I}$) and thus the capacitances Cπ and Cµ of the transistors 12A and 14A. The variable load circuit 10B includes transistors 12B and 14B, impedance circuits 16B and 18B, and variable current source 20B. The variable load circuit 10B operates to adjust the phase of the quadrature component (Q) based on the control signal ($CTRL_Q$), which controls the bias current ($I_{BIAS,Q}$) and thus the capacitances Cπ and Cµ of the transistors 12B and 14B.

The control signals ($CTRL_I$ and $CTRL_Q$) are provided to correct the phase error of the quadrature signals. More specifically, the quadrature component (Q) ideally leads the in-phase component (I) by 90°. However, due to factors such as an imperfect layout or component mismatches, there is typically a phase error between the in-phase (I) and quadrature (Q) components of the quadrature signal. When the quadrature component (Q) leads the in-phase component (I) by less than 90°, there is a negative phase error and the control signals ($CTRL_I$ and $CTRL_Q$) are provided such that the in-phase component (I) is delayed relative to the quadrature component (Q) by an amount that offsets the phase error. When the quadrature component (Q) leads the in-phase component (I) by more than 90°, there is a positive phase error and the control signals ($CTRL_I$ and $CTRL_Q$) are provided such that the quadrature component (Q) is delayed relative to the in-phase component (I) by an amount that offsets the phase error. For example, the quadrature component (Q) may lead the in-phase component (I) by 92° and thus have a phase error of 2°. Accordingly, the control signals ($CTRL_I$ and $CTRL_Q$) are provided such that the phase of the quadrature component (Q) is shifted by essentially −2° with respect to the phase of the in-phase component (I), thereby essentially nulling the phase error. In one embodiment, the control signal ($CTRL_I$) is provided such that the bias current ($I_{BIAS,I}$) is zero and the in-phase component (I) is not delayed by the variable load circuit 10A, and the control signal ($CTRL_Q$) is provided such that the variable load circuit 10B shifts the phase of the quadrature component (Q) by essentially −2°. As another example, the quadrature component (Q) may lead the in-phase component (I) by 89° and thus have a phase error of −1°. Accordingly, the control signals ($CTRL_I$ and $CTRL_Q$) are provided such that the phase of the in-phase component (I) is shifted by essentially −1° with respect to the phase of the quadrature component (Q), essentially nulling the phase error. In one embodiment, the control signal ($CTRL_Q$) is provided such that the bias current ($I_{BIAS,Q}$) is zero and the quadrature component (Q) is not delayed by the variable load circuit 10B, and the control signal ($CTRL_I$) is provided such that the variable load circuit 10A delays the in-phase component by essentially 1°.

Figure 3:
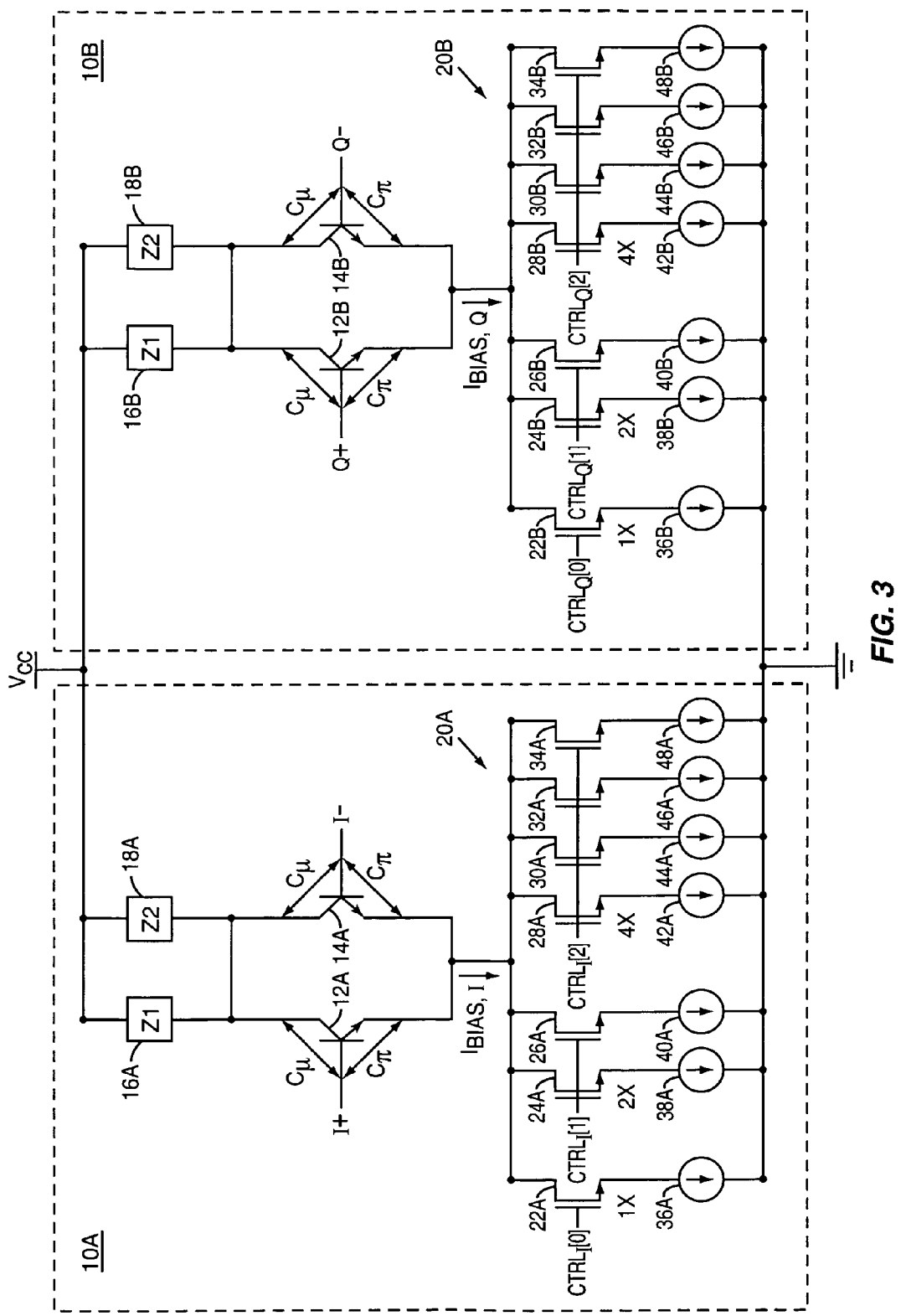
FIG. 3 illustrates an exemplary variable current source for the system of FIG. 2 according to one embodiment of the present invention.

FIG. 3 illustrates one embodiment of the variable current sources 20A and 20B of the variable load circuits 10A and 10B of FIG. 2 wherein the control signals ($CTRL_I$ and $CTRL_Q$) are digital control signals. It is to be understood that this embodiment of the variable current sources 20A and 20B also applies to the variable current source 20 of FIG. 1. As illustrated, the variable current source 20A includes transistor switches 22A-34A and current sources 36A-48A. The transistor switch 22A receives bit zero of the control signal (CTRL$_I$), the transistor switches 24A and 26A receive bit 1 of the control signal (CTRL$_I$), and the transistor switches 28A-34A receive bit 2 of the control signal (CTRL$_I$). Thus, the transistor switches 22A-34A operate to couple the corresponding current sources 36A-48A to the emitters of the transistors 12A and 14A based on the corresponding bits of the control signal (CTRL$_I$). Accordingly, the bias current (I$_{BIAS,I}$) is controlled by control signal (CTRL$_I$).

Similarly, the variable current source 20B includes transistor switches 22B-34B and current sources 36B-48B. The transistor switch 22B receives bit zero of the control signal (CTRL$_Q$), the transistor switches 24B and 26B receive bit 1 of the control signal (CTRL$_Q$), and the transistor switches 28B-34B receive bit 2 of the control signal (CTRL$_Q$). Thus, the transistor switches 22B-34B operate to couple the corresponding current sources 36B-48B to the emitters of the transistors 12B and 14B based on the corresponding bits of the control signal (CTRL$_Q$). Accordingly, the bias current (I$_{BIAS,Q}$) is controlled by control signal (CTRL$_Q$).

Although the variable current sources 20A and 20B are illustrated as operating based on three bits of the control signals (CTRL$_I$ and CTRL$_Q$) and having the seven transistors 22-34 and corresponding current sources 36-48, the variable current sources 20A and 20B may operate based on any number of bits and have any number of transistor switches and corresponding current sources. Further, although the variable current sources 20A and 20B are illustrated such that the bits 0-2 of the control signals (CTRL$_I$ and CTRL$_Q$) control 1, 2, and 4 of the transistor switches 22A-34A and 22B and 34B, respectively, it should be noted that each of the bits of the control signals (CTRL$_I$ and CTRL$_Q$) may control any number of transistor switches.

It should also be noted that the embodiments of the variable current sources 20A and 20B illustrated in FIG. 3 are exemplary and not limiting. Numerous embodiments of the variable current sources 20A and 20B will be apparent to one having ordinary skill in the art.

FIG. 4 is a graphical illustration of phase correction versus bias current (I$_{BIAS}$) for one embodiment of the variable load circuits 10A and 10B of FIGS. 2 and 3. The values, or bit settings, of the control signal (CTRL$_I$) are illustrated by the positive x-axis, and the values, or bit settings, of the control signal (CTRL$_Q$) are illustrated by the negative x-axis. It should be further noted that the phase correction values are positive when the phase error is negative (Q leading I by less than 90°), and the phase correction values are negative when the phase error is positive (Q leading I by more than 90°). Thus, if the quadrature component (Q) is leading the in-phase component (I) by 88.5°, there is a −1.5° phase error and a +1.5° phase correction is needed. The bit setting for the control signal (CTRL$_I$) that produces a phase correction (Δφ) that is closest to +1.5° phase correction is selected. In one embodiment, a controller (not shown) may select the bit setting for the control signal (CTRL$_I$) by sequentially stepping through the bit settings of the control signals (CTRL$_I$, CTRL$_Q$) until the appropriate phase correction is achieved. In another embodiment, the controller determines if there is a positive phase error or a negative phase error. If there is a positive phase error, the controller steps through the bit settings for the control signal (CTRL$_Q$) until the phase error is essentially zero. If there is a negative phase error, the controller steps through the bit settings for the control signal (CTRL$_I$) until the phase error is essentially zero. In another embodiment, the controller may determine the phase error and select the appropriate bit setting based on a known phase correction versus bit setting characteristic.

FIG. 5 illustrates an exemplary implementation of variable load circuit 10 of the present invention. In this embodiment, the variable load circuits 10A and 10B, such as illustrated in FIGS. 2 and 3, are implemented in a quadrature local oscillator (LO) generator 50. The quadrature LO generator 50 may be used in a transceiver for either upconversion of a signal to be transmitted or for downconversion of a received signal. The quadrature LO generator 50 includes a voltage controlled oscillator (VCO) 52, dividers 54 and 56, a multiplexer 58, and the variable load circuits 10A, 10B, 10C, and 10D. The variable load circuits 10A and 10B operate as described above with respect to FIGS. 1-4 to correct the phase error of a quadrature high band signal (I$_{HB}$ and Q$_{HB}$) from the divider 54, and the variable load circuits 10C and 10D operate as described above with respect to FIGS. 1-4 to correct the phase error of a low band quadrature signal (I$_{LB}$ and Q$_{LB}$) from the divider 56. The multiplexer 58 provides either the high band quadrature signal (I$_{HB}$ and Q$_{HB}$) or the low band quadrature signal (I$_{LB}$ and Q$_{LB}$) to buffers 60 and 62 based on a mode of operation.

A controller 64 provides high band control signals (CTRL$_{I,HB}$ and CTRL$_{Q,HB}$) to the variable load circuits 10A and 10B and low band control signals (CTRL$_{I,LB}$ and CTRL$_{Q,LB}$) to the variable load circuits 10C and 10D such that phase errors in the high band quadrature signal (I$_{HB}$ and Q$_{HB}$) and the low band quadrature signal (I$_{LB}$ and Q$_{LB}$) are corrected. In one embodiment, the controller 64 monitors the quadrature output signal (I and Q) or some quadrature signal derived from the quadrature output signal (I and Q), such as a quadrature output signal from an associated mixer, when the multiplexer 58 is providing the high band quadrature signal (I$_{HB}$ and Q$_{HB}$). Based on the monitored quadrature signal, the controller 64 determines the phase error between the in-phase and quadrature components of the monitored quadrature signal. In one embodiment, the controller 64 then determines bit settings for each of the control signals (CTRL$_{I,HB}$ and CTRL$_{Q,HB}$) that essentially nulls the phase error. In another embodiment, the controller 64 determines if there is a positive or negative phase error. If there is a positive phase error, the controller 64 sets the control signal (CTRL$_{I,HB}$) to zero and sequentially steps through bit settings for the control signal (CTRL$_{Q,HB}$) until the phase error is essentially zero. In yet another embodiment, the controller 64 steps through the bit settings for both of the control signals (CTRL$_{I,HB}$ and CTRL$_{Q,HB}$) until the phase error is essentially zero. The process is repeated while the multiplexer 58 is providing the low band quadrature signal (I$_{LB}$ and Q$_{LB}$) such that the controller 64 generates the control signals (CTRL$_{I,HB}$ and CTRL$_{Q,HB}$) to correct the phase error of the monitored signal during low band operation.

It is important to note that that variable load circuits 10A-10D do not disturb the operation of the quadrature LO generator 50. Further, the controller 64 may be part of the quadrature LO generator 50, a controller of a mobile transceiver in which the quadrature LO generator 50 is implemented, or a controller used to program the control signals (CTRL) after fabrication. It should also be noted that the quadrature LO generator 50 of FIG. 5 is an exemplary implementation of the variable load circuit 10 of the present invention. It is to be understood that the variable load circuit 10 can be used in any system where it is desirable to correct phase error of a quadrature signal. Further, the phase error can be corrected immediately after fabrication of the system or at any time thereafter.

Those skilled in the art will recognize improvements and modifications to the preferred embodiments of the present invention. All such improvements and modifications are considered within the scope of the concepts disclosed herein and the claims that follow.

What is claimed is:

1. A system comprising:
   a first variable load circuit comprising:
   a first transistor having a first terminal, a second terminal, and a third terminal, the first terminal adapted to receive a first component of a differential input signal;
   a second transistor having a first terminal, a second terminal, and a third terminal, the first terminal adapted to receive a second component of the differential input signal, and the second terminal coupled to the second terminal of the first transistor; and
   a first variable current source coupled to the third terminals of the first and second transistors and adapted to generate a first current based on a first control signal;
   wherein the first and second transistors operate to adjust a phase of the differential signal based on the first current generated by the first variable current source.

2. The system of claim 1 wherein each of the first and second transistors of the first variable load circuit create a first capacitance between the first and second terminals and a second capacitance between the first and third terminals and each of the first and second capacitances are a function of the first current generated by the first variable current source and operate to adjust the phase of the differential signal based on the first current.

3. The system of claim 1 wherein the first control signal is a digital control signal.

4. The system of claim 1 wherein the differential input signal is a differential in-phase component (I) of a quadrature signal such that the first and second transistors operate to adjust a phase of the in-phase component (I) of the quadrature signal based on the first current generated by the first variable current source.

5. The system of claim 4 further comprising:
   a second variable load comprising:
   a third transistor having a first terminal, a second terminal, and a third terminal, the first terminal adapted to receive a first component of a differential quadrature component (Q) of the quadrature signal;
   a fourth transistor having a first terminal, a second terminal, and a third terminal, the first terminal adapted to receive a second component of the differential quadrature component (Q) of the quadrature signal, and the second terminal coupled to the second terminal of the third transistor; and
   a second variable current source coupled to the third terminals of the third and fourth transistors and adapted to generate a second current based on a second control signal;
   wherein the third and fourth transistors operate to adjust a phase of the quadrature component (Q) of the quadrature signal based on the second current generated by the second variable current source.

6. The system of claim 5 wherein each of the first, second, third, and fourth transistors create a first capacitance between the first and second terminals and a second capacitance between the first and third terminals.

7. The system of claim 6 wherein the first and second capacitances of the first and second transistors are each a function of the first current generated by the first variable current source and operate to adjust the phase of the in-phase component (I) of the quadrature signal based on the first current and the first and second capacitances of the third and fourth transistors are each a function of the second current generated by the second variable current source and operate to adjust the phase of the quadrature component (Q) of the quadrature signal based on the second current.

8. The system of claim 5 wherein the first and second control signals are digital control signals.

9. The system of claim 8 further comprising a controller adapted to provide the first and second control signals to reduce a phase error of the quadrature signal such that the quadrature component (Q) of the quadrature signal leads the in-phase component (I) of the quadrature signal by essentially 90°.

10. The system of claim 9 wherein the controller is further adapted to provide first and second control signals such that the in-phase component (I) of the quadrature signal is delayed relative to the quadrature component (Q) of the quadrature signal when the quadrature component (Q) leads the in-phase component by less than 90°.

11. The system of claim 9 wherein the controller is further adapted to provide the first and second control signals such that the quadrature component (Q) of the quadrature signal is delayed relative to the in-phase component (I) of the quadrature signal when the quadrature component (Q) leads the in-phase component by more than 90°.

12. The system of claim 8 further comprising a controller adapted to provide the control signals wherein when a phase error exists between the in-phase component (I) and the quadrature component (Q) of the quadrature signal, the first and second control signals are provided to step through each bit setting for the first and second control signals until the phase error of the quadrature signal is reduced to essentially zero.

13. The system of claim 8 wherein the first variable current source comprises a plurality of current sources each coupled to the third terminals of the first and second transistors via a corresponding plurality of transistor switches each controlled by a corresponding bit of the first control signal.

14. The system of claim 8 wherein the second variable current source comprises a plurality of current sources each coupled to the third terminals of the third and fourth transistors via a corresponding plurality of transistor switches each controlled by a corresponding bit of the second control signal.

15. The system of claim 5 further comprising a controller adapted to monitor a phase error of the quadrature signal and provide the first and second control signals based on the phase error such that the phase error is reduced to essentially zero.

16. A system comprising:
   a) a controlled oscillator adapted to provide a differential oscillator output signal;
   b) a first divider adapted to divide the differential oscillator output signal and provide a first quadrature signal having a differential in-phase component and a differential quadrature component;
   c) a first variable load circuit comprising:
   i) a first transistor having a first terminal, a second terminal, and a third terminal, the first terminal adapted to receive a first component of the differential in-phase component;
   ii) a second transistor having a first terminal, a second terminal, and a third terminal, the first terminal adapted to receive a second component of the differential in-phase component, and the second terminal coupled to the second terminal of the first transistor; and
   iii) a first variable current source coupled to the third terminals of the first and second transistors and adapted to generate a first current based on a first control signal;

wherein the first and second transistors operate to adjust a phase of the differential in-phase component based on the first current generated by the first variable current source; and d) a second variable load comprising:
  i) a third transistor having a first terminal, a second terminal, and a third terminal, the first terminal adapted to receive a first component of the differential quadrature component (Q);
  ii) a fourth transistor having a first terminal, a second terminal, and a third terminal, the first terminal adapted to receive a second component of the differential quadrature component (Q), and the second terminal coupled to the second terminal of the third transistor; and
  iii) a second variable current source coupled to the third terminals of the third and fourth transistors and adapted to generate a second current based on a second control signal;
  wherein the third and fourth transistors operate to adjust a phase of the differential quadrature component (Q) based on the second current generated by the second variable current source.

17. The system of claim 16 wherein each of the first, second, third, and fourth transistors create a first capacitance between the first and second terminals and a second capacitance between the first and third terminals.

18. The system of claim 17 wherein the first and second capacitances of the first and second transistors are a function of the first current generated by the first variable current source and operate to adjust the phase of the in-phase component (I) of the first quadrature signal based on the first current and the first and second capacitances of the third and fourth transistors are a function of the second current generated by the second variable current source and operate to adjust the phase of the quadrature component (Q) of the first quadrature signal based on the second current.

19. The system of claim 16 wherein the first and second control signals are digital control signals.

20. The system of claim 19 further comprising a controller adapted to provide the first and second control signals to reduce a phase error of the first quadrature signal such that the quadrature component (Q) of the first quadrature signal leads the in-phase component (I) of the first quadrature signal by essentially 90°.

21. The system of claim 20 wherein the controller is further adapted to provide the first and second control signals such that the in-phase component (I) of the first quadrature signal is delayed relative to the quadrature component (Q) of the first quadrature signal when the quadrature component (Q) leads the in-phase component by less than 90°.

22. The system of claim 20 wherein the controller is further adapted to provide the first and second control signals such that the quadrature component (Q) of the first quadrature signal is delayed relative to the in-phase component (I) of the first quadrature signal when the quadrature component (Q) leads the in-phase component by more than 90°.

23. The system of claim 19 further comprising a controller adapted to provide the first and second control signals wherein when a phase error exists between the in-phase component (I) and the quadrature component (Q) of the first quadrature signal, the first and second control signals are provided to step through each bit setting for the first and second control signals until the phase error of the first quadrature signal is reduced to essentially zero.

24. The system of claim 16 further comprising a controller adapted to monitor a phase error of the first quadrature signal and provide the first and second control signals based on the phase error such that the phase error is reduced to essentially zero.

25. A method of adjusting a phase of a differential signal comprising:
  providing a first component of a differential signal to a first terminal of a first transistor;
  providing a second component of the differential signal to a first terminal of a second transistor, wherein a second terminal of the first transistor is coupled to a second terminal of the second transistor; and
  adjusting a first current supplied to a third terminal of each of the first and second transistors based on a first control signal, thereby adjusting a phase of the differential signal.

26. The method of claim 25 wherein a first capacitance is provided between the first and second terminals of each of the first and second transistors and a second capacitance is provided between the first and third terminals of each of the first and second transistors, and each of the first and second capacitances are a function of the first current such that the step of adjusting the first current adjusts the first and second capacitances and thus the phase of the differential signal.

27. The method of claim 25 wherein the differential input signal is a differential in-phase component (I) of a quadrature signal such that the first and second transistors operate to adjust a phase of the in-phase component (I) of the quadrature signal based on the first current generated by the first variable current source.

28. The method of claim 27 further comprising:
  providing a first component of a differential quadrature component (Q) of the quadrature signal to a first terminal of a third transistor;
  providing a second component the differential quadrature component (Q) of the quadrature signal to a first terminal of a fourth transistor, wherein a second terminal of the third transistor is coupled to a second terminal of the fourth transistor; and
  adjusting a second current supplied to a third terminal of each of the third and fourth transistors based on a second control signal, thereby adjusting a phase of the differential quadrature component (Q) of the quadrature signal.

29. The method of claim 28 wherein a first capacitance is provided between the first and second terminals of each of the first and second transistors, a second capacitance is provided between the first and third terminals of each of the first and second transistors, a third capacitance is provided between the first and second terminals of each of the third and fourth transistors, and a fourth capacitance is provided between the first and third terminals of each of the third and fourth transistors.

30. The method of claim 29 wherein each of the first and second capacitances are a function of the first current and the step of adjusting the first current adjusts the first and second capacitances and thus the phase of the in-phase component (I) of the quadrature signal, and each of the third and fourth capacitances are a function of the second current and the step of adjusting the second current adjusts the third and fourth capacitances and thus the phase of the quadrature component (Q) of the quadrature signal.

31. The system of claim 28 further comprising providing the first and second control signals to reduce a phase error of the quadrature signal such that the quadrature component (Q) of the quadrature signal leads the in-phase component (I) of the quadrature signal by essentially 90°.

32. The method of claim 31 wherein the step of providing the first and second control signal further comprises providing the first and second control signals such that the in-phase component (I) of the quadrature signal is delayed relative to the quadrature component (Q) of the quadrature signal when the quadrature component (Q) leads the in-phase component by less than 90°.

33. The method of claim 31 wherein the step of providing the first and second control signal further comprises providing the first and second control signals such that the quadrature component (Q) of the quadrature signal is delayed relative to the in-phase component (I) of the quadrature signal when the quadrature component (Q) leads the in-phase component by more than 90°.

34. The method of claim 28 further comprising providing the first and second control signals to step through each bit setting for the first and second control signals until a phase error between the in-phase component (I) and the quadrature component (Q) of the quadrature signal is reduced to essentially zero.

35. The system of claim 28 further comprising monitoring a phase error of the quadrature signal and providing the first and second control signals based on the phase error such that the phase error is reduced to essentially zero.

\* \* \* \* \*